United States Patent [19]

Munekawa

[11] Patent Number: 4,588,023
[45] Date of Patent: May 13, 1986

[54] DEVICE FOR RELEASING HEAT

[75] Inventor: Masaaki Munekawa, Oyama, Japan

[73] Assignee: Showa Aluminum Corporation, Osaka, Japan

[21] Appl. No.: 580,756

[22] Filed: Feb. 17, 1984

Related U.S. Application Data

[62] Division of Ser. No. 273,087, Jun. 12, 1981, Pat. No. 4,449,578.

[30]      Foreign Application Priority Data

Jun. 16, 1980 [JP]  Japan .................................. 55-82252
Jun. 16, 1980 [JP]  Japan .................................. 55-82253
Jun. 16, 1980 [JP]  Japan .................................. 55-82254

[51] Int. Cl.[4] ............................................. F28D 15/00
[52] U.S. Cl. ........................... 165/104.33; 165/104.21; 357/82; 361/385
[58] Field of Search ...................... 165/104.33, 104.21; 357/82; 361/385

[56]            References Cited
U.S. PATENT DOCUMENTS 3,143,592  8/1964  August .......................... 165/104.21
4,369,838  1/1983  Asanuma et al. .................... 165/185

FOREIGN PATENT DOCUMENTS 2543075  7/1976  Fed. Rep. of Germany ...... 361/385
  65891  5/1980  Japan .............................. 165/104.33

Primary Examiner—Albert W. Davis, Jr.

[57]            ABSTRACT

A heat releasing device comprises an extruded aluminum main body including a horizontal wall for attaching heat emitting elements thereto and a vertical wall formed with a large number of gouged fins on at least one of its opposite sides, and a heat pipe portion provided on or in the vertical wall. The heat released from heat emitting elements, such as semiconductor elements, mounted on the horizontal wall is absorbed by the main body, transferred to the heat pipe portion and then radiated from the fins on the vertical wall.

1 Claim, 8 Drawing Figures

DEVICE FOR RELEASING HEAT

This application is a division of Ser. No. 273,087, filed June 12, 1981, now U.S. Pat. No. 4,449,578 granted May 22, 1984.

BACKGROUND OF THE INVENTION

The present invention relates to heat releasing devices, and more particularly to devices for releasing heat from heat emitting elements, such as transistors, thyristors and like semiconductor elements, attached thereto.

The term "aluminum" as used herein and in the claims includes pure aluminum, commercial aluminum containing small amounts of impurities and aluminum alloys.

Heat releasing devices of the type mentioned are generally those including fins and made entirely of extruded aluminum. To assure specified strength of the die, however, there are limitations on the height of the fins and also on the spacing between the fins in view of the extrusion orifice. Accordingly if a group of fins are adapted to provide the desired effective heat releasing area, the device becomes large-sized. Extrusion techniques further involve limitations on the thickness of fins, consequently rendering the heat releasing device heavier. In addition, heat releasing devices made of extruded material are limited in heat releasing efficiency, so that a larger number of such devices must be used for releasing heat from an increased number of heat emitting elements, giving rise to the necessity of using longer lead wires for the heat emitting elements. In the case of acoustic systems, this is likely to produce a distorted sound or noises. It is therefore desired to provide heat releasing devices which are small-sized, lightweight and efficient.

SUMMARY OF THE INVENTION

To meet the above demand, the present invention provides a heat releasing device comprising an extruded aluminum main body having a predetermined cross section and including a portion for attaching heat emitting elements thereto and a finned portion, and a heat pipe portion provided on or in the main body. Since the present device achieves an exceedingly higher heat releasing efficiency than conventional like devices, the device can be made small-sized and lightweight. The device eliminates the foregoing problem encountered with acoustic systems because an increased number of heat emitting elements can be attached to the device.

This invention will be described below in greater detail with reference to the accompanying drawings.

DESCRIPTION OF THE PREFERRED EMBODIMENTS

Figure 1:
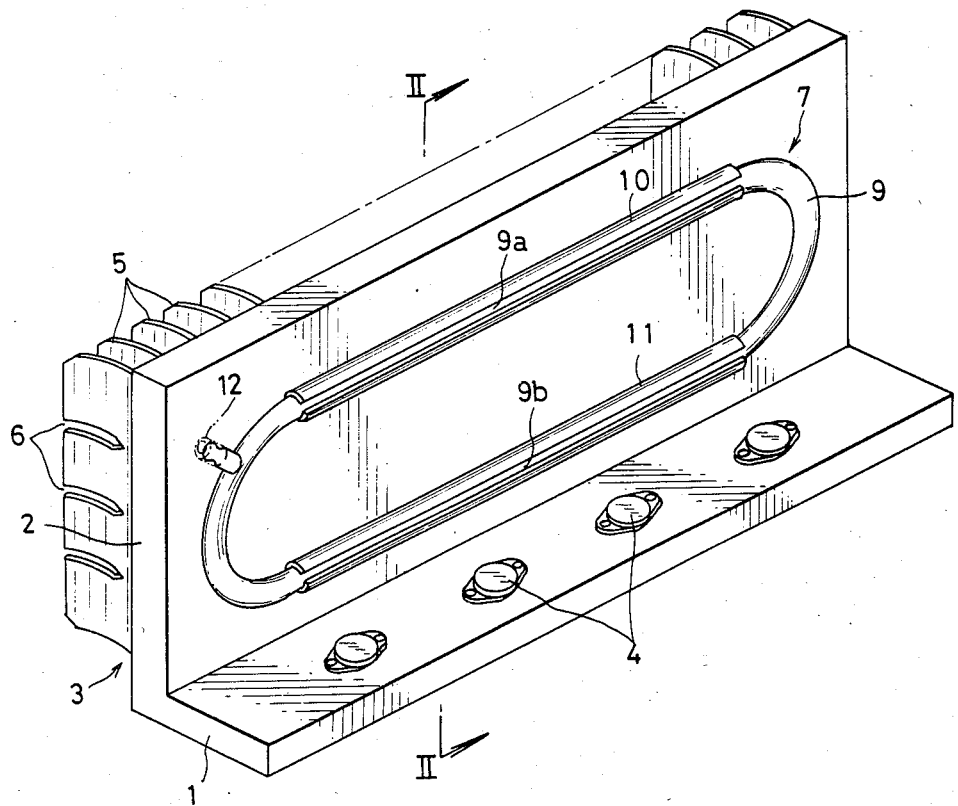
FIG. 1 is a perspective view showing a heat releasing device embodying the invention.

Throughout the drawings, like parts are referred to by like reference numerals.

Figure 2:
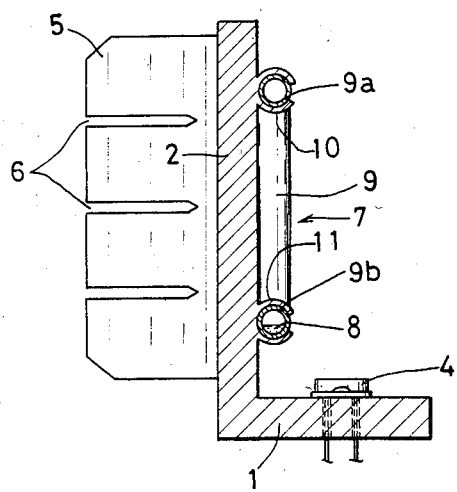
FIG. 2 is a view in section taken along the line II—II in FIG. 1.

The heat releasing device shown in FIGS. 1 and 2 includes an extruded aluminum main body 3 L-shaped in cross section and having a horizontal wall 1 serving as portion for attaching heat emitting elements thereto, and a vertical wall 2 serving as a finned portion. Heat emitting elements 4, which are semiconductors, are mounted on the horizontal wall 1 at a predetermined spacing. The vertical wall 2 has a large number of fins 5 integral with the main body 3 and formed on one side of the wall by gouging the main body at a specified spacing. Each of the fins 5 extends perpendicular to the vertical wall 2 and is formed with a plurality of horizontal cutouts 6. The technique for forming gouged fins is disclosed in detail in U.S. Pat. No. 3,202,212. The vertical wall 2 has a heat pipe portion 7 on the other side thereof. The heat pipe portion 7 is provided by a looped pipe having a vacuum interior and containing a working fluid 8 enclosed therein. The looped pipe 9 is in the form of a laterally elongated ellipse and includes upper and lower two straight tubular portions 9a and 9b in parallel. The two straight tubular portions 9a and 9b are fixedly fitted in holders 10 and 11 of C-shaped cross section formed integrally with the vertical wall 2 and spaced apart one above the other in corresponding relation to these portions. The holders 10, 11 are approximately equal to the straight tubular portions 9a, 9b in length. when the main body 3 is extruded, the holders 10, 11 are U-shaped in cross section and have an opening slightly larger in width than the outside diameter of the looped pipe 9 as indicated in broken lines in FIG. 2. With the straight tubular portion fitted into the holder through the opening, the upper and lower walls defining the opening are bent along the outer periphery of the tubular portion, whereby the holder is formed to the C-shaped cross section. The looped pipe 9 is made in the form of a laterally elongated ellipse in its entirety by joining a hairpin pipe to a U-shaped pipe by butt welding. The working fluid 8 is introduced into the looped pipe 9 through an inlet 12 provided on the upper side of an arcuately bent end portion of the pipe 9 and indicated in a broken line in FIG. 1. The inlet 12 is thereafter closed by crimping as indicated in a solid line in FIG. 1. Examples of useful working fluids are water, Freon 12, etc.

The working fluid 8 in the lower tubular portion 9b is heated and vaporized with the heat transferred from the heat emitting elements 4 to the tubular portion 9b through the horizontal wall 1 and the lower portion of the vertical wall 2, and flows through the arcuately bent ends of the looped pipe 9 into the upper tubular portion 9a, where the vapor of working fluid liquefies and releases heat, and the liquefied fluid returns to the lower tubular portion 9b. The heat released from the vapor on liquefaction is transferred through the upper tubular portion 9a and the upper part of the vertical wall 2 to the fins 5 and radiated therefrom. Since the looped pipe 9 includes the upper straight tubular portion 9a and the lower straight tubular portion 9b which are in communication with each other, the working fluid, when liquefied at the condensing portion, returns to the vaporizing portion even when the tubular portions are horizontal. In the case of a heat pipe comprising a single horizontal straight tube, the working fluid must be returned with use of a wick, which increases the thermal resistance and which is costly to make. It is therefore desirable to use a heat pipe including no wick. The looped pipe is advantageous in that it does not require such a wick. When desired, however, a wick may be provided in the upper straight tubular portion 9a of the looped pipe 9.

Figure 3:
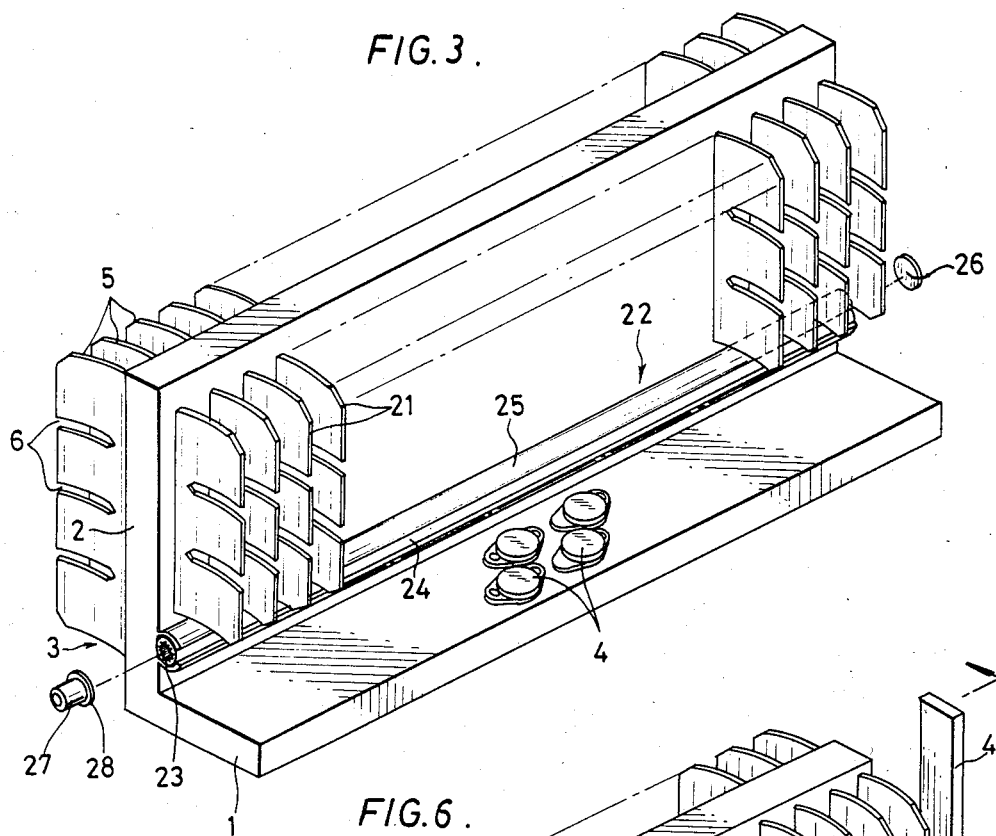
FIG. 3 is a perspective view showing another heat releasing device embodying the invention.

FIG. 3 shows another heat releasing device embodying the invention. The device includes a vertical wall 2 formed with fins 5, 21 on both sides. The fins 21 on one side, which are formed by gouging like the fins 5 on the other side, have lower ends which are positioned at a higher level than those of the latter fins 5, with the result that an unfinned portion is formed at the lower part of the vertical wall 2. The vertical wall 2 is provided with heat pipe portion 22 on the unfinned lower part. The heat pipe portion 22 comprises a horizontal straight pipe 24 provided with a wick 23 on its inner periphery, containing a working fluid (not shown) enclosed therein, closed at its opposite ends and having a vacuum interior. The straight pipe 24 is fixedly fitted in a holder 25 C-shaped in cross section and formed integrally with the vertical wall 2. The holder 25 has a length approximately equal to that of the straight pipe 24. The straight pipe 24 is fixed to the holder 25 by the same procedure as is the case with the foregoing embodiment. Although the holders 10, 11 and 25 shown in FIGS. 1 and 3 are each in the form of an integral piece, such a holder may comprise separate segments. One end of the straight pipe 24 is closed with a circular aluminum closure 26 welded thereto. A similar circular closure 28 having an inlet 27 is welded to the other end of the pipe 24. The working fluid is introduced into the pipe 24 through the inlet 27, which is thereafter closed by crimping. Although metal netting is used for the wick 23, other material is usable.

With this embodiment, a plurality of heat emitting elements 4 are attached to the central portion of the horizontal wall 1 collectively.

Heat is transferred from the heat emitting elements 4 through the horizontal wall 1 and the lower part of the vertical wall 2 to the middle portion of the straight pipe 24 to heat and vaporize the working fluid in this portion. The vapor of working fluid flows to the opposite ends of the pipe 24, in which the vapor releases heat and liquefies, and the resulting liquid returns to the middle portion. The heat released from the vapor on liquefaction is transferred from the pipe ends through the vertical wall 2 to the fins 5, 21, from which the heat is radiated.

Figure 4:
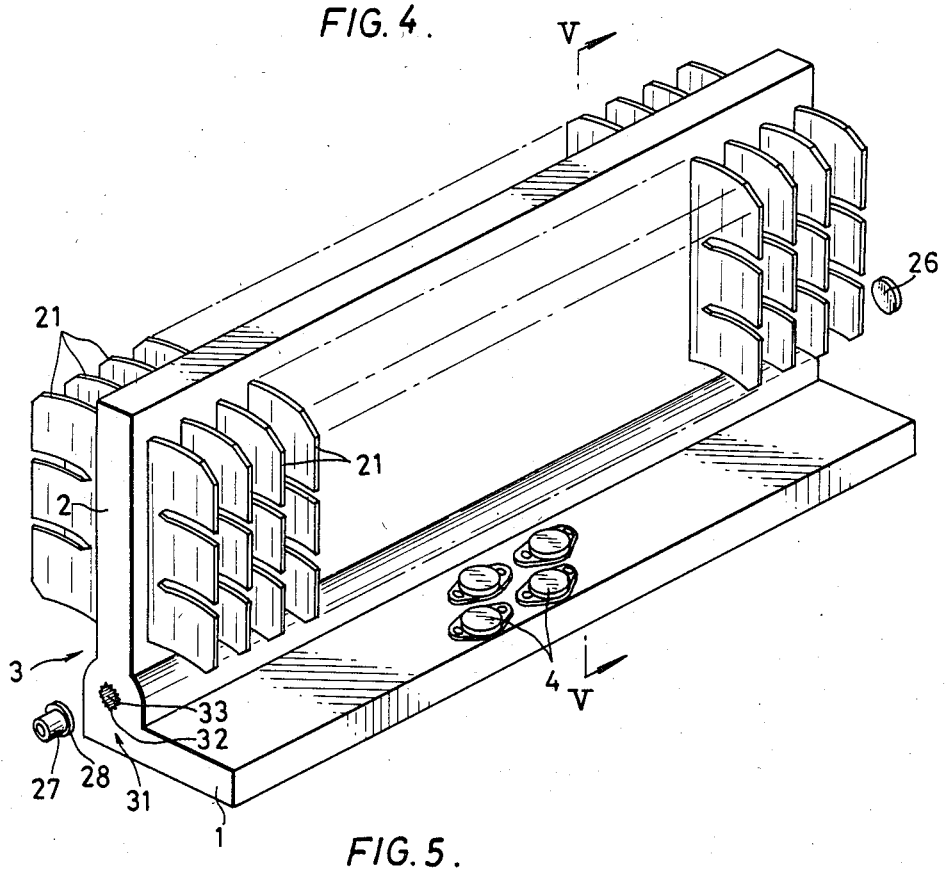
FIG. 4 is a perspective view showing another heat releasing device embodying the invention.
Figure 5:
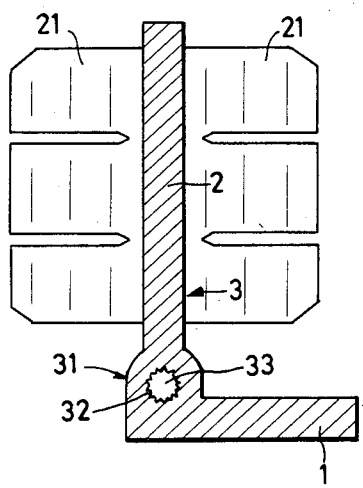
FIG. 5 is a view in section taken along the line V—V in FIG. 4.

FIGS. 4 and 5 show another heat releasing device embodying the invention. The device includes a vertical wall 2 having fins 21 which are formed on each of its opposite sides and similar to those on the right side of the vertical wall of FIG. 3. The vertical wall 2 is provided with a heat pipe portion 31 at a lower part thereof over the entire length of the wall. The heat pipe portion 31 is provided by a horizontal hollow portion 33 formed in the vertical wall 2 itself, having a wick 32 on its inner periphery, containing a working fluid (not shown) enclosed therein, closed at its opposite ends and having a vacuum interior. The vertical wall 2 has a larger thickness at the lower part including the hollow portion 33 than at the other part. The wick 32 of this embodiment is in the form of a multiplicity of longitudinal grooves each having a V-shaped cross section and formed in the inner surface of the hollow portion 33. The hollow portion 33 with the wick 32 is formed simultaneously when the main body 3 is extruded. The wick may be shaped otherwise.

This embodiment has substantially the same heat releasing action as the embodiment of FIG. 3.

Figure 6:
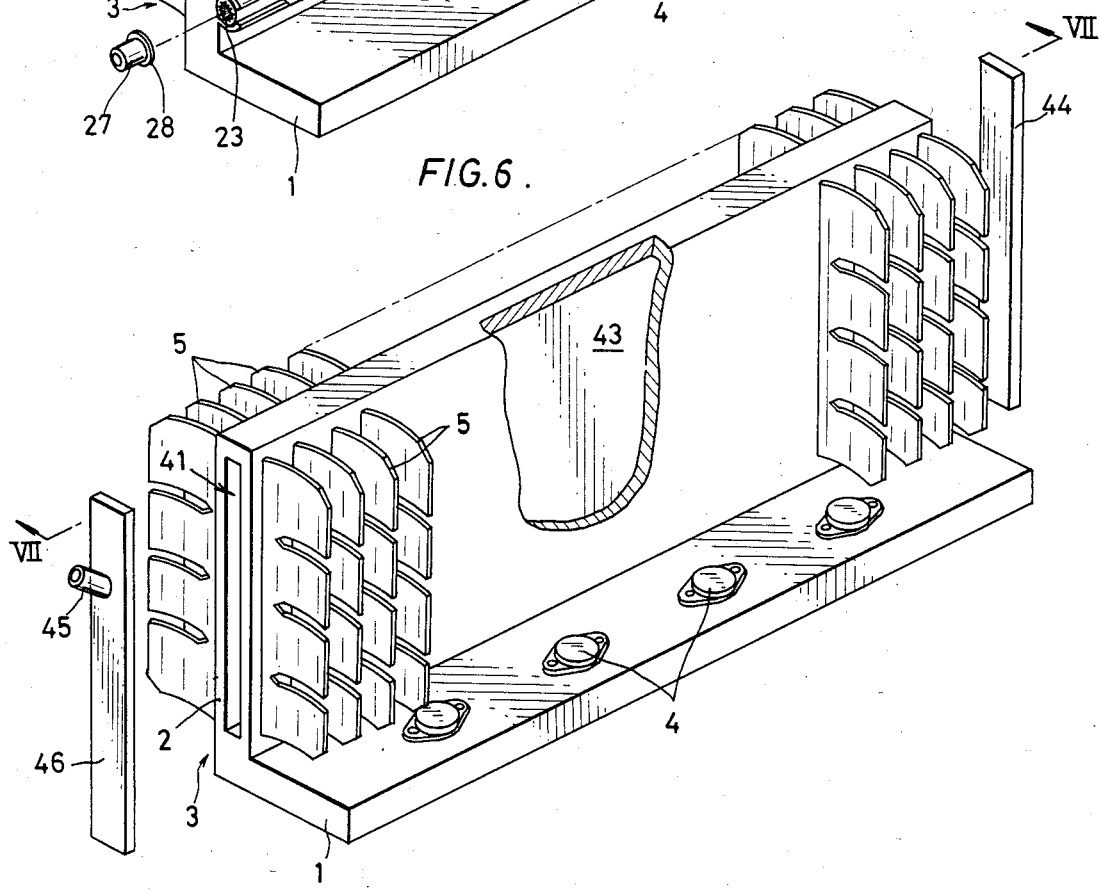
FIG. 6 is a perspective view partly broken away and showing another heat releasing device embodying the invention.
Figure 7:
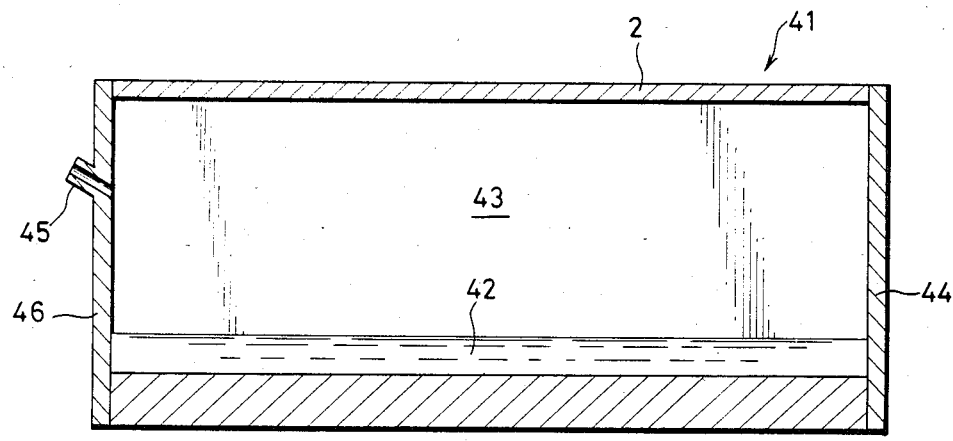
FIG. 7 is a view in section taken along the line VII—VII in FIG. 6.

FIGS. 6 and 7 show another heat releasing device embodying the invention. The device includes a vertical wall 2 having fins 5 which are formed on each of its opposite sides and similar to those at the left of FIG. 1. The vertical wall 2 has a heat pipe portion 41 substantially entirely therethrough. The heat pipe portion 41 is provided by a hollow portion 43 in the form of a vertically elongated rectangle in cross section, formed in the vertical wall 2 itself, containing a working fluid 42 enclosed therein, closed at its opposite ends and having a vacuum interior. The hollow portion 43 of this embodiment is formed simultaneously when the main body 3 is extruded as is the case with the above embodiment. One end of the hollow portion 43 is closed with a rectangular aluminum closure 44 welded thereto. The other end of the hollow portion 43 has welded thereto a similar rectangular closure 46 having an inlet 45. As is the case with the preceding embodiments, the working fluid is introduced into the heat pipe portion through the inlet 45, which is thereafter closed by crimping. A plurality of heat emitting elements 4 are attached to the horizontal wall 1 at a predetermined spacing in the same manner as in the embodiment shown in FIG. 1.

The working fluid 42 at the bottom of the hollow portion 43 is heated and vaporized with the heat transferred thereto from the heat emitting elements 4 by way of the horizontal wall 1 and the lower portion of the vertical wall 2, and the vapor flows to the upper part of the hollow portion 43, in which the vapor releases heat and liquefies. The resulting liquid returns to the bottom. The heat released from the vapor on liquefaction is transferred through the upper portion of the vertical wall 2 to the fins 5, from which the heat is radiated.

Figure 8:
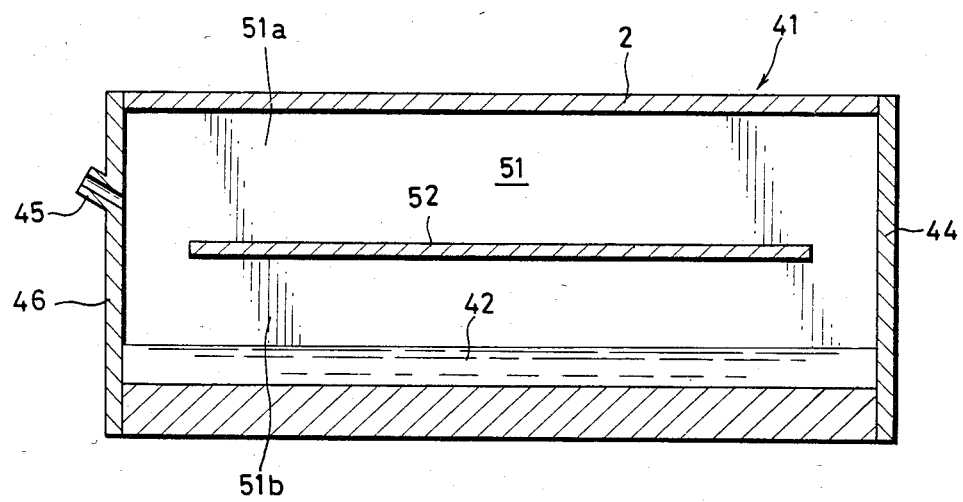
FIG. 8 is a sectional view corresponding to FIG. 7 and showing a modification of the hollow portion of the embodiment shown in FIG. 6.

FIG. 8 shows a modification of the hollow portion of the embodiment shown in FIG. 6. The modified hollow portion 51 has a horizontal partition wall 52 permitting the upper and lower parts of the hollow portion to communicate with each other at its opposite ends, whereby a looped channel is formed which includes an upper passageway 51a and a lower passageway 51b.

In the hollow portion 51 having the looped channel, the working fluid 42 therefor flows in convection in the same manner as the working fluid 8 in the looped pipe 9 shown in FIGS. 1 and 2.

Although FIGS. 3 to 6 show vertical walls having fins on both sides thereof, such fins may be formed on only one side of the wall. Furthermore, the fins are not limited to those of the gouged type as illustrated. Similarly useful are corrugated fins brazed to a planar vertical wall.

What is claimed is:

1. A device for releasing heat comprising:
   (a) an extruded aluminum main body having a predetermined cross section and including a portion for attaching heat emitting elements thereto and a finned portion, and
   (b) a heat pipe portion provided in the vertical wall in the main body, the main body including a horizontal wall and a vertical wall, the horizontal wall serving as the portion for attaching heat emitting elements thereto, the vertical wall being formed with fins on at least one of the opposite sides to serve as the fin portion, having the heat pipe portion substantially entirely therethrough, and the heat pipe portion is provided by a hollow portion formed in the vertical wall itself, containing a working fluid enclosed therein, closed at its opposite ends and having a vacuum interior, said hollow portion has a horizontal partition wall permitting the upper and lower parts of the hollow portion to communicate with each other at its opposite ends to thereby form a looped channel including an upper passageway and a lower passageway.

* * * * *